(12) United States Patent
Neyret et al.

(10) Patent No.: US 6,939,783 B2
(45) Date of Patent: Sep. 6, 2005

(54) PREVENTIVE TREATMENT METHOD FOR A MULTILAYER SEMICONDUCTOR WAFER

(75) Inventors: Eric Neyret, Sassenage (FR); Christophe Maleville, La Terrasse (FR)

(73) Assignee: S.O.I.Tec Silicon on Insulator Technologies, S.A., Bernin (FR)

(*) Notice: Subject to any disclaimer, the term of this patent is extended or adjusted under 35 U.S.C. 154(b) by 0 days.

(21) Appl. No.: 10/784,040

(22) Filed: Feb. 20, 2004

(65) Prior Publication Data

US 2004/0197963 A1 Oct. 7, 2004

Related U.S. Application Data

(60) Provisional application No. 60/483,477, filed on Jun. 26, 2003.

(30) Foreign Application Priority Data

Mar. 4, 2003 (FR) .............................. 03 02623

(51) Int. Cl.$^7$ .......................... H01L 21/30; H01L 27/01
(52) U.S. Cl. ........................ 438/455; 438/458; 257/347
(58) Field of Search ................ 438/458, 455, 438/406; 257/347, 354

(56) References Cited

U.S. PATENT DOCUMENTS

| | | | | |
|---|---|---|---|---|
| 4,795,718 A | * | 1/1989 | Beitman | .................... 438/297 |
| 4,952,526 A | * | 8/1990 | Pribat et al. | ................. 438/412 |
| 5,426,073 A | * | 6/1995 | Imaoka et al. | .............. 438/597 |
| 5,723,385 A | * | 3/1998 | Shen et al. | .................. 438/763 |
| 6,150,696 A | | 11/2000 | Iwamatsu et al. | ........... 257/347 |
| 6,232,201 B1 | * | 5/2001 | Yoshida et al. | ............. 438/423 |

FOREIGN PATENT DOCUMENTS

| | | |
|---|---|---|
| EP | 1 158 581 | 11/2001 |
| JP | 7161948 | 6/1995 |
| JP | 2000299451 | 10/2000 |
| WO | WO 01/15218 A1 | 11/2001 |
| WO | WO 03/005434 A2 | 1/2003 |

OTHER PUBLICATIONS

Jean–Pierre Colinge, "Silicon–On–Insulator Technology: Materials to VSLI", 2nd Edition" by, published by "Kluwer Academic Publishers", at pp. 50 an 51." 1997.

\* cited by examiner

*Primary Examiner*—Olik Chaudhuri
*Assistant Examiner*—Lex H. Malsawma
(74) *Attorney, Agent, or Firm*—Winston & Strawn LLP

(57) ABSTRACT

A preventive treatment method for a multilayer semiconductor wafer is described. The semiconductor wafer includes a supporting substrate, at least one intermediate layer and a surface layer in which an intermediate layer has an exposed lateral edge and the wafer is to be subjected to a subsequent treatment. The method includes encapsulating the exposed lateral edge of the intermediate layer with a portion of the surface layer to prevent attack on the peripheral edge during the subsequent treatment.

18 Claims, 3 Drawing Sheets

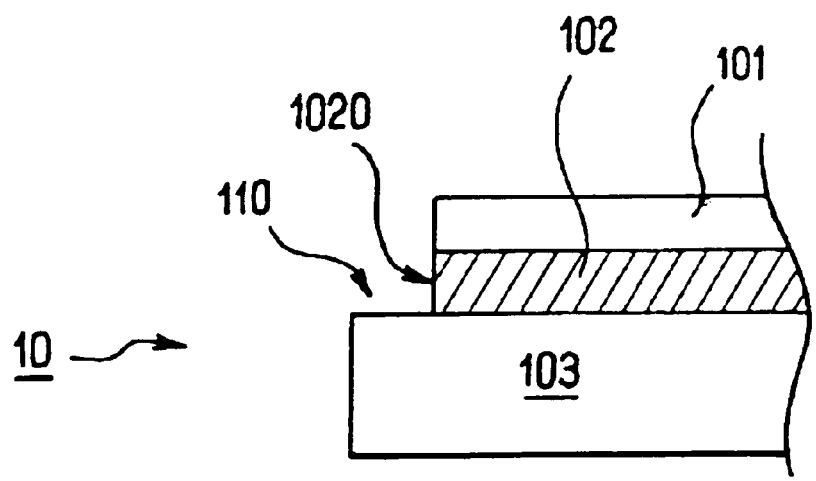
FIG_1
PRIOR ART
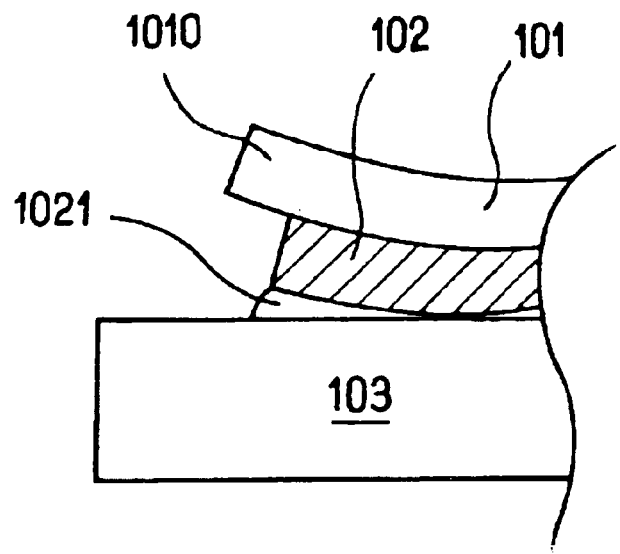
FIG_2
PRIOR ART

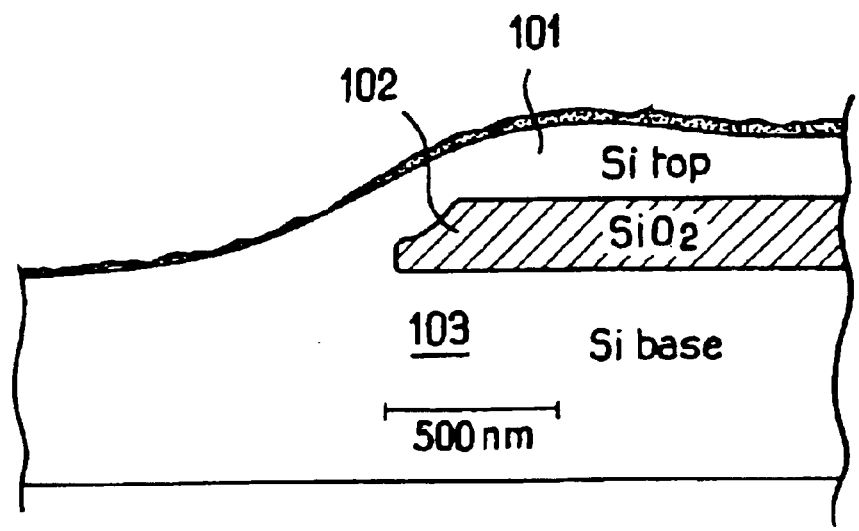
FIG_4
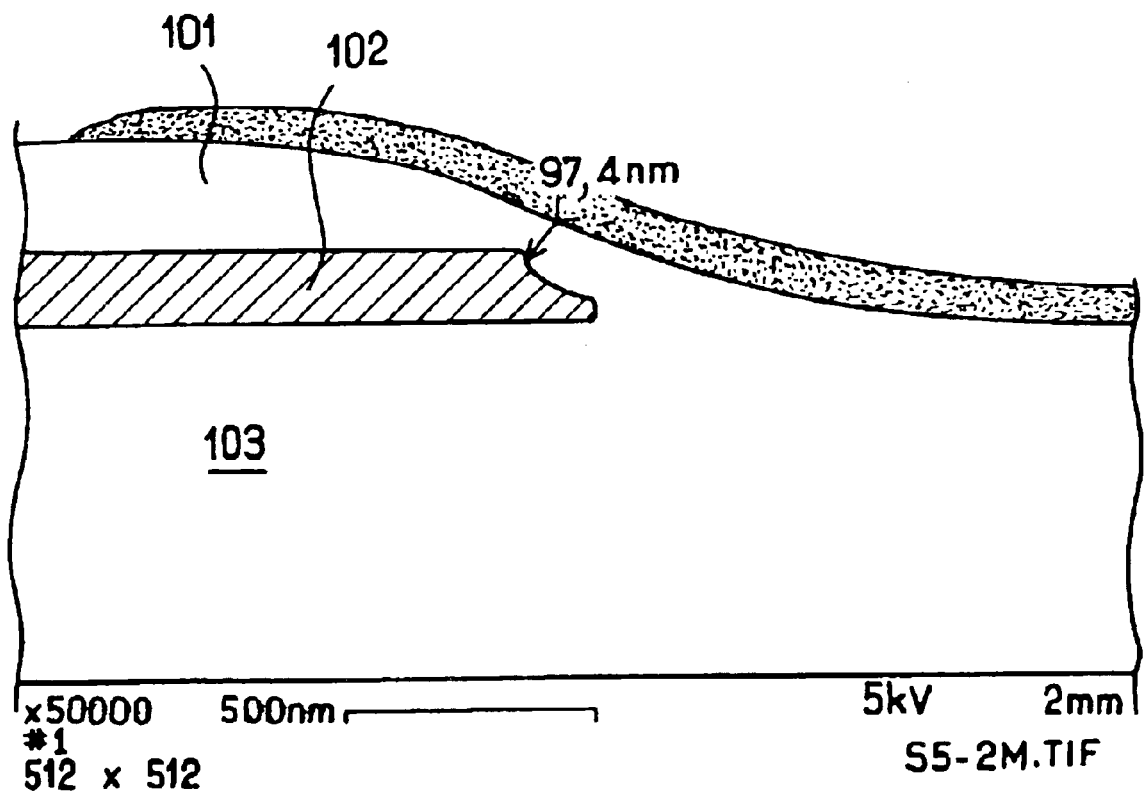
FIG_5

PREVENTIVE TREATMENT METHOD FOR A MULTILAYER SEMICONDUCTOR WAFER

This application claims the benefit of provisional application No. 60/483,477, filed Jun. 26, 2003.

BACKGROUND ART

The invention generally relates to a preventive treatment process for the exclusion zone of a multilayer semiconductor wafer.

Processes for transferring layers to make multilayer structures from semiconductor materials are known. Conventional processes include creating a weakened zone within the thickness of a donor substrate, bonding the donor substrate to a receiving substrate, and detaching at the weakened zone. The weakened zone may be created in association with the creation of different layers at the surface of the donor substrate. Following detachment, at least one layer of the donor substrate can be transferred onto a receiving substrate. This type of process builds up wafers that may be, for example, of the SOI (Silicon On Insulator) type. Such a process can also be used to make other types of multilayer wafers. The wafer obtained may have one or several intermediate layers between the surface layer of the final wafer and the base layer that corresponds to the receiving substrate. Thus, an SOI may include an intermediate insulating layer (for example made of SiO2) between the receiving substrate and the silicon surface layer.

An example a transfer process is the SMART-CUT® process, and a description of the process can be found in a book entitled: "Silicon-On-Insulator Technology: Materials to VSLI, 2nd Edition" by Jean-Pierre Colinge, published by "Kluwer Academic Publishers", at pages 50 and 51. This transfer process can be used to create multilayer wafers like those mentioned above. It can also be used to create wafers with an extremely thin surface layer having a thickness on the order of a few microns or less.

It is noted that the transfer of a layer during the detachment step could be accompanied by the formation of an approximately annular peripheral shoulder around the wafer. This shoulder is referred to as an exclusion zone because no bonding occurs in that area and subsequently no layer is transferred in that area. It has been observed that use of the SMART-CUT® type process can generate such areas. FIG. 1 shows this type of area about the edge of an SOI type wafer 10.

The wafer 10 includes a surface layer 101 (which usually corresponds to the useful layer of the wafer) made of monocrystalline silicon that overlaps an SiO2 layer 102. These two layers 101 and 102 are bonded to a layer 103 corresponding to the receiving substrate. The layer 103 may be made of polycrystalline silicon, for example. The layer 102 is an intermediate layer that has been inserted between the surface layer 101 of the wafer and its base layer 103. A exclusion zone 110 is also shown, and extends around the entire periphery of the wafer 10. The exclusion zone 110 results from the detachment of layers 101 and 102 from a weakened donor substrate.

FIG. 1 also shows that the intermediate layer 102 has an exposed peripheral edge 1020. Exposure of the peripheral edge of the intermediate layer 102 can have negative consequences, which will be explained below.

Complementary treatments are usually applied to the wafer after the detachment step. Complementary treatments are used to improve the surface condition of the wafer (particularly to reduce the surface roughness), or to modify the crystalline structure of one or several layers, or to reinforce the bond between the layers of the wafer. Such treatments may involve a chemical attack and/or heat treatment of the wafer. For example, the treatments may include a "stabox" step.

A "stabox" operation performed on a wafer is generally known in the art and corresponds to the following steps. The surface of the wafer is oxidized to create an oxide layer on the surface of the wafer that will protect the surface during the next heat treatment. Next, a heat treatment is used to stabilize the bonding interface. For example, annealing at a temperature on the order of about 1100° C. can be used for this purpose. Lastly, deoxidation of the oxide deposited on the surface of the wafer is carried out. For example, a chemical attack using an HF etching type solution could be used, with the HF solution having a concentration of about 10 to 20%.

When a "stabox" type operation is carried out on an SOI wafer like that shown in FIG. 1, the intermediate layer 102 of the wafer is attacked around its periphery. The result is shown in FIG. 2, wherein the layer 102 has been affected by removal of material towards the center of the wafer (towards the right in the drawing of FIG. 2). The removal of material results from an attack on the peripheral edge or belt around the layer 102 which was exposed by the etching solution used during the deoxidation operation.

FIG. 2 also shows that the surface layer 101 overhangs the intermediate layer 102 due to the setback of the intermediate layer, because the side edge of the surface layer 101 extends beyond the edge of the intermediate layer 102. Such an overhanging configuration may be harmful. In particular, the overhanging portion 1010 of the layer 101 may collapse and/or break. If a piece of the overhanging portion 1010 detaches, it could adversely affect the wafer. For example, such a detached piece could be deposited on one of the faces of the wafer and cause surface deterioration (for example, by scratching it or remaining attached to it).

Semiconductor wafers are typically intended for use in electronics, microelectronics and optoelectronics, and must satisfy extremely strict surface condition specifications. The overhanging configuration illustrated in FIG. 2 would fail to satisfy such specifications.

FIG. 2 also illustrates an additional adverse effect resulting from the use of a "stabox" operation. In particular, the layers 101 and 102 are curved as the edges of these layers have been raised and separated from the base layer 103. This curvature corresponds to an additional effect of the "stabox" step, and includes a setback of the intermediate layer and the creation of an overhang. This additional effect is a consequence of the thermal stresses applied to the different layers of the wafer, particularly during the oxidation heat treatment of the wafer surface. Since the different layers in the wafer do not have the same coefficients of thermal expansion, the layers do not behave in the same way when they are exposed to a higher thermal budget. The result is a partial delamination of layers 102 and 103 at the edge of the layer 102. Furthermore, during the same oxidation heat treatment, the free space formed between the layers 102 and 103 due to the separation has been partially filled in by a new oxide 1021.

However, it is noted that this additional effect is not a major disadvantage. Shrinkage of the intermediate layer 102 is a more serious problem, which may be the result of a chemical attack on the wafer. It may also be the result of a different type of attack on the peripheral belt or edge around the intermediate layer which is sensitive to such an attack. If the wafer is subjected to a prolonged high temperature heat treatment, for example, in a furnace used to treat wafers in batches, then an attack occurs around the exposed periphery of an intermediate layer of oxide of an SOI structure. It may be desirable to perform such a heat treatment, for example, to modify the crystalline structure of some layers, or to reduce the surface roughness of the wafer.

Prolonged high temperature heat treatment is conventionally carried out within a hydrogen and/or argon atmosphere. The term "high temperature" means a temperature exceeding about 950° C. In addition, the term "prolonged" means a heat treatment applied for a duration of greater than a few minutes.

Another example of a treatment that causes problems like those mentioned above occurs when an additional "stabox" step is performed (for example on an SOI type wafer) after carrying out a first "stabox" step and polishing the wafer. A non-limiting example of such a treatment is described in International Application No. WO 01/15218, which describes a surface treatment of an SOI type wafer involving a sequence of stabox, polishing, and stabox type steps. The stabox process is disclosed in that document and can be referred to for further details, if necessary.

FIG. 3a diagrammatically shows an SOI structure on which a first stabox step was carried out. The edges of the layers 101 and 102 form a steep bevel following polishing. This bevel shape exposes the edge of the intermediate layer 102 to a greater extent than that shown in FIG. 1.

FIG. 3b shows the same SOI structure as FIG. 3a, on which a polishing step and then a second stabox step were conducted. The bevel shape has been modified by these new steps. But the intermediate layer 102 is still exposed, and is therefore still subject to attack by subsequent treatments that may be applied to the wafer. Thus, it is clear that some treatments (particularly chemical treatments, and/or prolonged high temperature heat treatments) applied to a multilayer wafer having an intermediate layer with an exposed peripheral edge may be detrimental.

Thus, there is a need for a treatment that can be applied to these wafers to protect the intermediate layer, and the present invention now provides this.

SUMMARY OF THE INVENTION

The invention relates to a preventive treatment method for a multilayer semiconductor wafer that includes a supporting substrate, at least one intermediate layer and a surface layer in which an intermediate layer has an exposed lateral edge and the wafer is to be subjected to a subsequent treatment. The method comprises encapsulating the exposed lateral edge of the intermediate layer with a portion of the surface layer to prevent attack on the peripheral edge during the subsequent treatment.

The encapsulating advantageously comprises annealing the wafer by heated to a temperature and for a time sufficient to cause the surface layer portion to cover the exposed lateral edge of the intermediate layer. This is preferably accomplished by a rapid thermal annealing as described herein.

The multilayer semiconductor wafer can be a silicon on insulator structure, or can be formed by transferring at least the surface layer from a donor wafer to at least one intermediate layer by a layer transfer technique. The surface layer can be transferred by forming a zone of weakness in the donor wafer at a depth sufficient to define the surface layer, bonding the surface layer of the donor wafer to the intermediate layer of the supporting substrate and then detaching the surface layer from the donor wafer. The zone of weakness is preferably formed by implanting ions into the donor wafer.

The wafer can thus be subjected to the subsequent treatment without detrimentally affecting the edge of the intermediate layer. The subsequent treatment may be either a chemical attack or a prolonged high temperature heat treatment. Also, the wafer can be subjected to a stabox process prior to encapsulating the exposed edge of the intermediate layer.

BRIEF DESCRIPTION OF THE DRAWINGS

Other aspects, purposes and advantages of the invention will become clear after reading the following description with reference to the attached drawings, in which:

FIGS. 1, 2, 3a and 3b illustrate conventional wafer structures that result from various prior art treatments;

FIG. 4 is an enlarged, simplified view, derived from a scanning electron microscope, of an edge of an SOI wafer treated according to a first embodiment of the invention; and FIG. 5 is an enlarged, simplified view similar to FIG. 4, of the edge of an SOI wafer treated according to a second embodiment of the invention.

DETAILED DESCRIPTION OF THE PREFERRED EMBODIMENTS

Figure 3A:
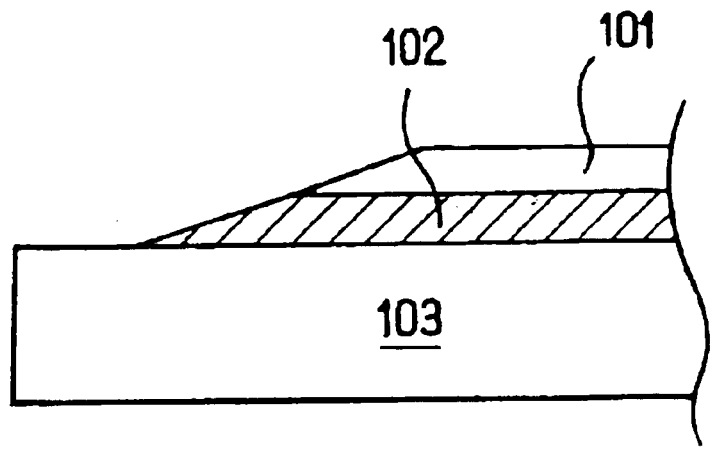
Figure 3B:
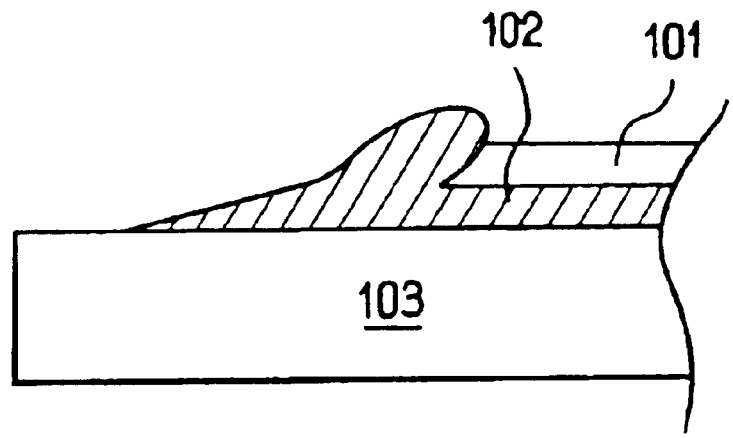

The invention overcomes the disadvantages of the prior art by providing a process for advantageously treating the exposed edge of a multilayer semiconductor wafer that was formed using a layer transfer technique. The process includes rapid thermal annealing (RTA) of the wafer to cause overlapping and encapsulation of the peripheral edge of the intermediate layer by the material of a superficial region of the surface of the wafer. This prevents an attack on the peripheral edge portion of the intermediate layer of the wafer during any subsequent treatment steps.

The following are preferred, but non-limiting aspects of such a process. Rapid thermal annealing (RTA) could be carried out immediately after the transfer of the wafer, or RTA could be carried out after an additional treatment step that occurs after the transfer of the wafer. The RTA may be advantageously carried out at a temperature on the order of 1200° C., and/or may be carried out for a duration of less than 3 minutes, and/or could be carried out under a hydrogen and/or argon atmosphere. The wafer may have an SOI structure, and the transfer could be conducted using a SMART-CUT® type process. Subsequent treatment steps for the wafer could include a chemical attack, or a prolonged high temperature heat treatment.

SOI wafers may be used, but any arbitrary type of multilayer wafer that satisfies the following two conditions could also be used. At least one intermediate layer of the wafer has an exposed lateral edge and the wafer is to be subjected to a subsequent treatment that could attack the periphery of the intermediate layer exposed edge (for example a chemical attack or a prolonged high temperature heat treatment). Consequently, the present process is advantageously used on a wafer having a structure that includes an exclusion zone like that shown in FIG. 1. Additionally, the wafer is preferably created using a transfer layer method (for example a SMART-CUT® type process).

For more detail about the SMART-CUT® method, reference may be made to the document entitled "Silicon-On-Insulator Technology: Materials to VLSI, $2^{nd}$ Edition" by J.-P. Colinge published by "Kluwer Academic Publishers", pages 50 and 51.

The present process utilizes RTA of the wafer to cause material on the surface region to overlap and then encapsulate the peripheral edge of the exposed intermediate layer. It has been observed that RTA causes a beneficial effect in the exposed intermediate layer. In particular, the RTA process can make the surface layer of the wafer "drop off" (in the case of an SOI wafer, the layer 101 shown in FIG. 1 corresponds to a layer of monocrystalline silicon). This surface layer also overlaps and encapsulates the periphery of the intermediate layer (layer 102 in FIG. 1) that was previously exposed. FIG. 4 illustrates this overlapping and encapsulation effect. In particular, FIG. 4 illustrates the case of an SOI wafer that had been exposed to a stabox step and then exposed to RTA. These steps carried out in this order results in stabilizing the bonding interface between the receiving substrate (layer 103) and the donor substrate (layers 101 and 102). As shown in FIG. 4, the intermediate layer 102 is entirely encapsulated by the surface layer 101. The layer 102 is thus protected from subsequent heat treatments that may be applied to the wafer.

The RTA is carried out at a high temperature for a short period. When an SOI wafer is treated, the heat treatment may be carried out at a temperature on the order of about 1150° C. to 1300° C. and preferably 1200° C. for a period of between about 1 and 5 minutes and preferably less than about 3 minutes. This RTA is preferably carried out in a hydrogen and/or argon atmosphere.

The RTA can also be done immediately after the wafer has been detached. In this case, the bonding interface between the layer 103 and the rest of the wafer had not been stabilized by a heat treatment. But tests have demonstrated that this embodiment can also be used to overlap and encapsulate the intermediate layer without degrading the bonding interface. FIG. 5 is an illustration of this embodiment of the invention. (The edge in FIG. 5 represents the "right" edge of the wafer, while the "left" edge of the wafer is shown in the other figures.)

Referring to FIG. 5, the surface layer 101 overlaps and encapsulates the intermediate layer 102 so that it is protected from subsequent treatments. It should also be noted that the RTA has not degraded the bonding interface between layers 102 and 103. The RTA can thus be used immediately after the wafer has been detached, or during a subsequent step such as after a stabox step (see FIG. 4). In general, use of RTA is a means of securing the intermediate layer for subsequent heat treatment steps that may be applied to the wafer.

It should be noted that the present method can be applied to wafers other than SOI wafers. It is also possible to overlap and encapsulate several intermediate layers in the wafer instead of a single layer.

In general, the present technique causes overlapping and encapsulation of a surface region of the wafer by a layer of material. In particular, this layer of material may come from the surface layer of the wafer, as shown in the present examples illustrated above. In all of the embodiments, the RTA protects the intermediate layer of the wafer so that it is then possible to apply subsequent treatments like those mentioned above to the wafer. In particular, a wafer treated according to the present method can be subjected to a prolonged high temperature heat treatment without degrading the intermediate layer. However, note that in this case, a polishing step (such as CMP) should not be conducted between the use of RTA and the prolonged high temperature heat treatment. The polishing step under these circumstances would at least partially destroy the protection accorded the intermediate layer by the present method, so that a prolonged high temperature heat treatment could degrade the intermediate layer.

What is claimed is:

1. A preventive treatment method for a multilayer semiconductor wafer that includes a supporting substrate, at least one intermediate layer and a surface layer in which an intermediate layer has an exposed lateral edge and the wafer is to be subjected to a subsequent treatment, which method comprises treating the wafer to cause a portion of the surface layer to encapsulate the exposed lateral edge of the intermediate layer to prevent attack on the peripheral edge during the subsequent treatment, wherein the multilayer semiconductor wafer is formed by transferring at least the surface layer from a donor wafer to at least one intermediate layer by a layer transfer technique.

2. The method of claim 1 wherein the treating comprises annealing the wafer by heating to a temperature and for a time sufficient to cause the surface layer portion to cover the exposed lateral edge of the intermediate layer.

3. The method of claim 1 wherein the multilayer semiconductor wafer has a silicon on insulator structure.

4. The method of claim 1 wherein the surface layer is transferred by forming a zone of weakness in the donor wafer at a depth sufficient to define the surface layer, bonding the surface layer of the donor wafer to the intermediate layer of the supporting substrate and then detaching the surface layer from the donor wafer.

5. The method of claim 4 wherein the zone of weakness is formed by implanting ions into the donor wafer.

6. The method of claim 1 which further comprises subjecting the wafer to the subsequent treatment without detrimentally affecting the edge of the intermediate layer.

7. The method of claim 6 wherein the subsequent treatment is a chemical attack or a prolonged high temperature heat treatment.

8. The method of claim 1 which further comprises subjecting the wafer to a stabox process prior to encapsulating the exposed edge of the intermediate layer.

9. A preventive treatment method for a multilayer semiconductor wafer that includes a supporting substrate, at least one intermediate layer and a surface layer in which an intermediate layer has an exposed lateral edge and the wafer is to be subjected to a subsequent treatment, which method comprises annealing the wafer to cause a portion of the surface layer to encapsulate the exposed lateral edge of the intermediate layer to prevent attack on the peripheral edge during the subsequent treatment, wherein the annealing comprises a rapid thermal annealing conducted at a temperature about 1150° C. to 1300° C. for a time of about 1 to 5 minutes to cause the surface layer portion to cover the exposed lateral edge of the intermediate layer.

10. The method of claim 9 wherein the annealing temperature is on the order of about 1200° C. and the annealing time is less than about 3 minutes.

11. The method of claim 9 wherein the annealing is conducted under an atmosphere of hydrogen or argon.

12. A multilayer semiconductor wafer that includes a supporting substrate, at least one intermediate layer having an exposed lateral edge, and a monocrystalline surface layer from a donor wafer, wherein the exposed lateral edge of the intermediate layer is encapsulated with a portion of the monocrystalline surface layer to prevent attack on the peripheral edge during subsequent treatments, wherein the surface layer is made of a monocrystalline material and the exposed lateral edge of the intermediate layer is encapsulated by the monocrystalline material.

13. The wafer of claim 12 in the form of a silicon on insulator structure.

14. A preventive treatment method for a multilayer semiconductor wafer that includes a supporting substrate, at least one intermediate layer and a surface layer in which an intermediate layer has an exposed lateral edge and the wafer is to be subjected to a subsequent treatment, which method comprises encapsulating the exposed lateral edge of the intermediate layer with a portion of the surface layer to prevent attack on the peripheral edge during the subsequent treatment by heating the wafer using a rapid thermal annealing conducted at a temperature about 1150° C. to 1300° C. for a time of about 1 to 5 minute.

15. The method of claim 14 wherein the annealing temperature is on the order of about 1200° C. and the annealing time is less than about 3 minutes.

16. The method of claim 14 wherein the annealing is conducted under an atmosphere of hydrogen or argon and the surface layer is made of a monocrystalline material so that the exposed lateral edge of the intermediate layer is encapsulated with the monocrystalline material.

17. The method of claim 14 wherein the subsequent treatment is a chemical attack or a prolonged high temperature heat treatment.

18. The method of claim 14 further comprises subjecting the wafer to a stabox process prior to encapsulating the exposed edge of the intermediate layer.

* * * * *

UNITED STATES PATENT AND TRADEMARK OFFICE
CERTIFICATE OF CORRECTION

PATENT NO. : 6,939,783 B2
DATED : September 6, 2005
INVENTOR(S) : Neyret et al.

It is certified that error appears in the above-identified patent and that said Letters Patent is hereby corrected as shown below:

Column 6,
Line 10, after "the subsequent treatment, wherein the", change "multilaver" to -- multilayer --.

Column 7,
Line 9, after "for a time of about 1 to 5", change "minute" to -- minutes --.

Signed and Sealed this

Eighth Day of November, 2005

JON W. DUDAS
*Director of the United States Patent and Trademark Office*